(12) United States Patent
Yano et al.

(10) Patent No.: US 7,585,691 B2
(45) Date of Patent: Sep. 8, 2009

(54) SOLID-STATE IMAGING DEVICE AND METHOD FOR PRODUCING THE SAME

(75) Inventors: Toshihiko Yano, Takaoka (JP); Hitoshi Doi, Tonami (JP); Naoto Niisoe, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/149,136

(22) Filed: Apr. 28, 2008

(65) Prior Publication Data
US 2008/0213939 A1 Sep. 4, 2008

Related U.S. Application Data

(62) Division of application No. 11/030,998, filed on Jan. 10, 2005.

(30) Foreign Application Priority Data

Feb. 13, 2004 (JP) .............................. 2004-037509

(51) Int. Cl.
*H01L 21/00* (2006.01)
(52) U.S. Cl. ............. 438/48; 257/E27.13; 257/E21.001
(58) Field of Classification Search .................. 438/48, 438/69, 128, 151
See application file for complete search history.

(56) References Cited

U.S. PATENT DOCUMENTS 6,614,479 B1 9/2003 Fukusho et al.

| | | |
|---|---|---|
| 2001/0020715 A1 | 9/2001 | Yamasaki et al. |
| 2003/0016311 A1 | 1/2003 | Sato et al. |
| 2004/0125325 A1 | 7/2004 | Murai et al. |
| 2004/0142501 A1 | 7/2004 | Nakai et al. |
| 2004/0201072 A1* | 10/2004 | Rhodes ........................ 257/435 |

FOREIGN PATENT DOCUMENTS

JP 10-284710 10/1998

OTHER PUBLICATIONS

United States Office Action issued in U.S. Appl. No. 11/030,998, mailed Jan. 6, 2009.
United States Office Action issued in U.S. Appl. No. 11/030,998, mailed Apr. 28, 2009.
United States Office Action issued in U.S. Appl. No. 11/030,998, mailed Jun. 25, 2008.

* cited by examiner

*Primary Examiner*—Evan Pert
*Assistant Examiner*—Selim Ahmed
(74) *Attorney, Agent, or Firm*—McDermott Will & Emery LLP

(57) ABSTRACT

In a solid-state imaging device, a light-shielding film 10a is formed of at least one of a high melting point metal film or a high melting point metal compound film. The surface of the light-shielding film 10a is constituted by an amorphous silicon film 13. Instead of the amorphous silicon film 13, the surface of the light-shielding film may be covered with any one of a high melting point metal film containing silicon, a high melting point metal silicide film and an oxide film. Thus, the adherence between the light-shielding film 10a and the resist can be increased and the resist can be prevented from being peeled from the light-shielding film, and thus a solid-state imaging device with a high yield even with small pixels and a method for producing the same can be provided.

5 Claims, 10 Drawing Sheets

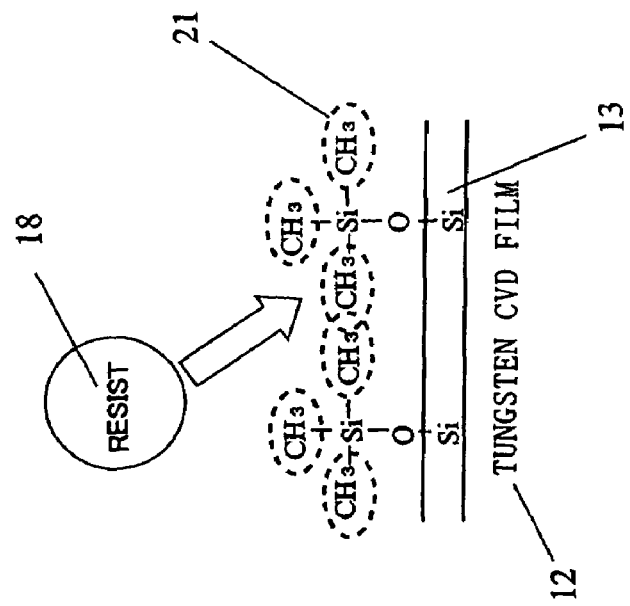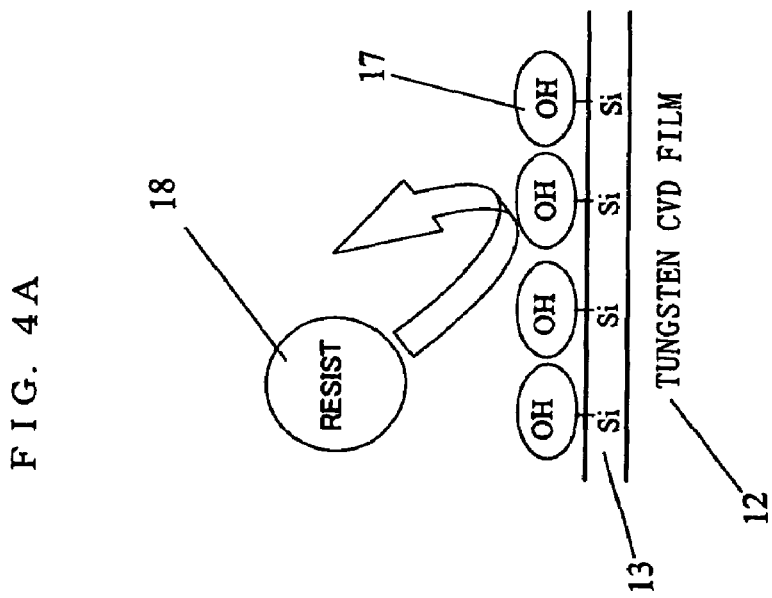
FIG. 4A  FIG. 4B  FIG. 4C

SOLID-STATE IMAGING DEVICE AND METHOD FOR PRODUCING THE SAME

RELATED APPLICATIONS

This application is a Divisional of U.S. Application No. 11/030,998, filed Jan. 10, 2005, claiming priority of Japanese Application No. 2004-037509, filed Feb. 13, 2004, the entire contents of each of which are hereby incorporated by reference.

BACKGROUND OF THE INVENTION

1. Field of the Invention

The present invention relates to a solid-state imaging device and a method for producing the same. More specifically, the present invention relates to a light-shielding film constituting pixels and a method for producing the same.

2. Description of the Background Art

In recent years, a demand for solid-state imaging devices has been increased, and the number of pixels has been increased while the size of a pixel has been increasingly reduced. In general, the pixels of a solid-state imaging device are provided with a light-shielding film in order to prevent light from falling on a portion other than a light-receiving area, and an opening through which light enters the light-receiving area is formed in a portion of the light-shielding film (e.g., Japanese Laid-Open Patent Publication No. 10-284710).

Hereinafter, a conventional solid-state imaging device will be described with reference to FIG. 9. FIG. 9 is a cross-sectional view showing the structure of a relevant portion of a conventional solid-state imaging device. In FIG. 9, a semiconductor substrate 1 is a substrate for forming a solid-state imaging device. A photodiode 2 serving as a sensor portion is formed in the main surface of the semiconductor substrate 1, and generates charges in accordance with the intensity of received light. Charge transfer portions 20 are formed in the main surface of the semiconductor substrate 1 and transport charges that are generated in the photodiode 2. A gate insulating film 3 is formed so as to cover the semiconductor substrate 1. Gate electrodes 4 are provided adjacent to each photodiode 2 via the gate insulating film 3 on the semiconductor substrate 1 and serve as a switch for moving charges generated in the photodiode 2 to the charge transfer portions 20. An interlayer insulating film 5 is formed so as to cover the gate insulating film 3 and the gate electrodes 4. A light-shielding film 10e is formed so as to cover the gate electrodes 4 to prevent light from falling on the gate electrodes 4.

A tungsten film having excellent light-shielding properties is used for the light-shielding film 10e, and in this example, a multilayered film in which a tungsten-sputtered film 11 that is formed by sputtering and a tungsten CVD film 12 that is formed by CVD (chemical vapor deposition) are laminated is used. In general, the tungsten CVD film 12 has a weak adherence with the interlayer insulating film 5 formed of silicon oxide, so that the tungsten-sputtered film 11 is provided as an adhesive layer between the interlayer insulating film 5 and the tungsten CVD film 12. An opening portion 6 is formed by removing the light-shielding film 10e positioned on the photodiode 2 to allow the photodiode 2 to receive light.

FIGS. 10A to 10E are cross-sectional views in each stage in the process of producing the light-shielding of the solid-state imaging device shown in FIG. 9. Hereinafter, a method for producing the light-shielding film 10e will be described with reference to FIGS. 10A to 10E. FIG. 10A shows a state in which the tungsten-sputtered film 11 is formed as a first film constituting the light-shielding film 10e on the semiconductor substrate 1. First, the photodiode 2 and the charge transfer portions 20 are formed in the main surface of the semiconductor substrate 1 by ion implantation or other methods. The gate insulating film 3 is deposited on the surface of the semiconductor substrate 1 by thermal oxidation or the CVD method. When the deposition of the gate insulating film 3 is completed, a necessary pattern (not shown) is formed by depositing a polysilicon film by the CVD method and performing photolithograph and dry-etching or the like so that the gate electrodes 4 are formed. Then, the interlayer insulating film 5 made of silicon oxide is deposited by oxidation/CVD method so as to cover the gate electrodes 4 and the gate insulating film 3. On the surface of the thus constituted substrate, the tungsten-sputtered film 11 having a thickness of 50 nm is formed as a first film constituting the light-shielding film by sputtering.

FIG. 10B shows a state in which the tungsten CVD film 12 is formed as a second film constituting the light-shielding film. First, after the tungsten-sputtered film 11 is deposited, the tungsten CVD film 12 having a thickness of 150 nm is deposited thereon by the CVD method. More specifically, using $WF_6$ (tungsten hexafluoride) and $SiH_4$ (silane gas) as reactant gas, a tungsten nucleation layer having a thickness of 50 nm is formed by supplying $WF_6$ at 20 sccm and $SiH_4$ at 10 sccm and controlling the chamber to be 30 Torr. Then, the tungsten CVD film 12 having a thickness of 150 nm is formed by supplying $WF_6$ at 95 sccm and $H_2$ (hydrogen gas) at 2000 sccm and controlling the chamber to be 90 Torr.

FIG. 10C shows a state in which a resist pattern 7 is formed in order to obtain a light-shielding film having a desired shape. First, after the tungsten CVD film 12 is deposited, a surfactant is applied thereon. As the surfactant, for example, hexamethyldisilazane (HMDS) [chemical formula: $(CH_3)_3Si—NH—Si(CH_3)_3$] is used. Then, after a HMDS treatment is performed, a resist is applied so that a resist film is formed. This resist film is exposed to light and developed, so that a resist pattern 7 that is patterned so as to form an opening portion 6 above the photodiode 2 is formed.

FIG. 10D shows a state in which the first and the second films constituting the light-shielding film 10e are patterned. The tungsten CVD film 12 and the tungsten-sputtered film 11 are dry-etched, using the resist pattern 7 as a mask. Thus, the tungsten CVD film 12 and the tungsten-sputtered film 11 corresponding to the opening portion 6 are removed.

Finally, the resist pattern 7 is removed, so that the patterned light-shielding film 10e can be obtained, as shown in FIG. 10E.

In recent years, with miniaturization of pixels, the pattern size of the light-shielding film 10e is being reduced. With this, peeling of the resist pattern 7 at the time of patterning the light-shielding film 10e has become a large problem.

The resist film constituting the resist pattern 7 inherently has a poor adherence with the tungsten CVD film 12. Therefore, the adherence between the tungsten CVD film 12 and the resist pattern 7 is increased by treating the surface of the tungsten CVD film 12 with a surfactant such as HMDS as described above. However, when the size of pixels is reduced, the area to which the surfactant is applied is also reduced, and therefore, after light exposure and development, the resist pattern 7 is easily peeled from the tungsten CVD film 12. When the tungsten-sputtered film 11 and the tungsten CVD film 12 are subjected to an etching treatment, using the peeled resist pattern 7 as a mask, then the light-shielding film 10e having a desired pattern cannot be obtained, and the yield is deteriorated.

SUMMARY OF THE INVENTION

The object of the present invention is to provide a solid-state imaging having a good yield in which a light-shielding film having a small pattern size can be formed so that the size of the pixels can be reduced, and a method for producing the same. In other to achieve this object, the present invention has the following features.

A first aspect of the present invention is directed to a solid-state imaging device outputting an electrical signal in accordance with an amount of incident light, comprising a light-receiving portion that is formed on a semiconductor substrate; and a light-shielding film in which an opening portion is formed above the light-receiving portion. The light-shielding film includes at least one of a high melting point metal film and a high melting point metal compound film having a light-shielding property. The greatest feature of this invention is that a surface of the light-shielding film has a property of adsorbing or bonding to a hydroxyl group when it is in contact with air. By using the light-shielding film having such characteristics, the adherence between the light-shielding film and the resist is increased, and even if the pattern size is small, the resist pattern can be prevented from being peeled after exposure and development. Consequently, the size of the pixels can be reduced.

An example of the surface of light-shielding film that has the above-described characteristics is the surface of the light-shielding film containing silicon. More specifically, the surface of the light-shielding film is formed of either one of a high melting point metal film containing silicon, an amorphous silicon film, and a high melting point metal silicide film. The surface of the light-shielding film may be formed of an oxide film such as silicon dioxide. When the surface of the light-shielding film is formed of a high melting point metal film containing silicon, a tungsten film can be used preferably as the high melting point metal film. In this case, it is preferable that the silicon content is 10 atm % or more.

A second aspect of the present invention is directed to a method for producing a solid-state imaging device having the above-described features. First, at least one of a high melting point metal film and a high melting point metal compound film having a light-shielding property is formed on the semiconductor substrate in which the light-receiving portion is formed. Then, a surface of the metal film is subjected to surface processing so as to have a property of adsorbing or bonding to a hydroxyl group when it is in contact with air. Then, a surfactant is applied onto the film that has been subjected to the surface processing. Then, a resist is applied on the surfactant to form a pattern. Then, the metal film that has been subjected to the surface processing is subjected to an etching treatment, using the obtained resist pattern as a mask. Finally, the resist pattern is removed so that a light-shielding film is formed.

As the surface processing of the metal film, there is a method in which a gas containing silicon is allowed to flow along the surface of the metal film so that silicon is contained in the metal film. When the gas is allowed to flow for a long time, an amorphous silicon film is formed on the metal film. Instead of the above-described surface processing treatment, a high melting point metal silicide film or an oxide film may be formed on the surface of the metal film.

With such a production method, a solid-state imaging device with small pixels can be produced with a good yield.

Thus, according to the present invention, the surface of the light-shielding film is constituted by either one of a high melting point metal film containing silicon, an amorphous silicon film, a high melting point metal silicide film and an oxide film, and the surface of the film is provided with a property of adsorbing or bonding to a hydroxyl group when it is in contact with air. Therefore, when the light-shielding film is exposed to light and developed for pattern formation, the film can be easily bonded to a surfactant, so that the adherence between the light-shielding film and the resist can be increased. As a result, a solid-state imaging device with a good yield in which even if the pattern size of the light-shielding film is small, the resist pattern can be prevented from being peeled, and the size of the pixels can be reduced, and a method for producing the same can be realized.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 4A to 4C are schematic diagrams for illustrating the reason why the light-shielding film shown FIG. 2 and a resist are tightly attached;

DESCRIPTION OF THE PREFERRED EMBODIMENTS

First Embodiment

Figure 1:
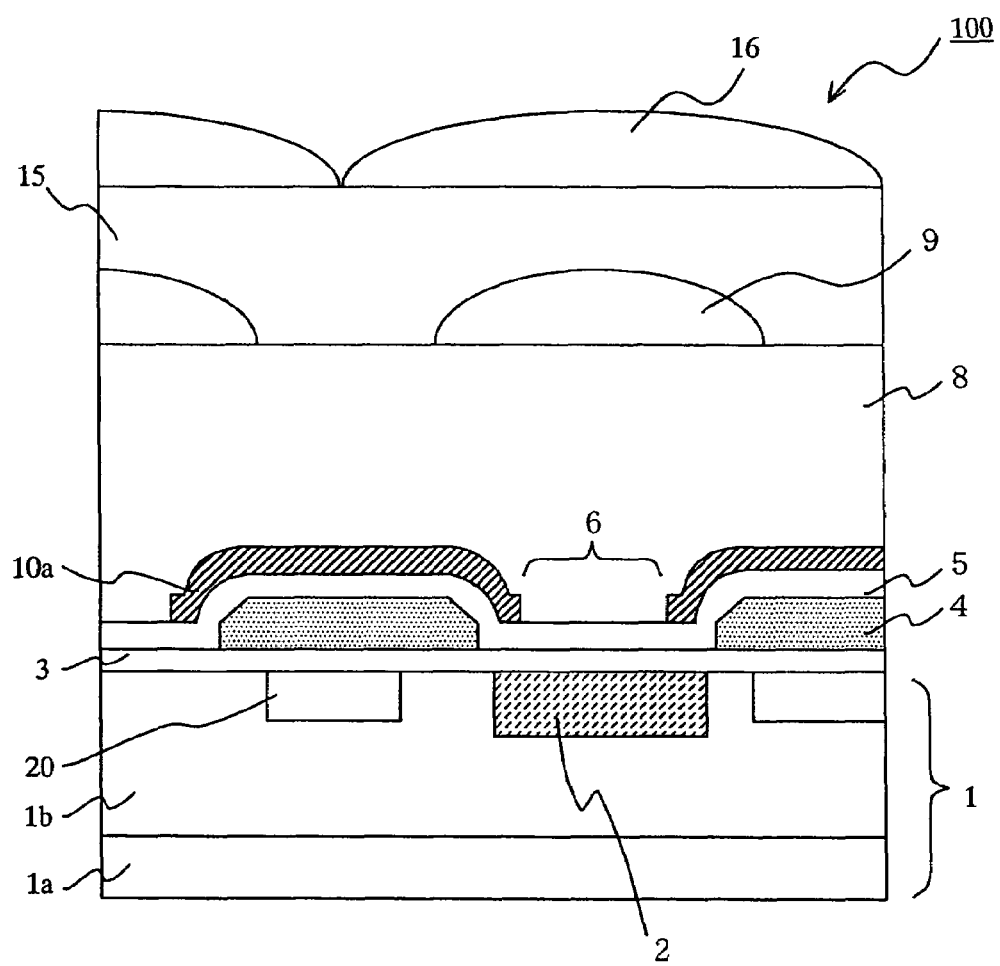
FIG. 1 is a cross-sectional view of a solid-state imaging device.

FIG. 1 shows an example of a cross-sectional structure of a commonly used solid-state imaging device. In a solid-state imaging device 100 shown in FIG. 1, a semiconductor substrate 1 is an epitaxial high-resistivity substrate in which an epitaxial layer 1b is formed on a main surface of a silicon substrate la by epitaxially growing a single crystal silicon layer. Photodiodes 2 of a conductivity type opposite to that of the epitaxial layer 1b are formed in a main surface of the semiconductor substrate 1 and generate charges in accordance with the intensity of received light. Charge transfer portions 20 are formed in the main surface of the semiconductor substrate 1 and transport charges that are generated in the photodiodes 2. Gate electrodes 4 are provided adjacent to each photodiode 2 on the semiconductor substrate 1 and serve as switches for moving the charges generated in the photodiodes 2 to the charge transfer portions 20. A light-shielding film 10a is formed so as to cover entirely the gate electrodes 4. The light-shielding film 10a prevents light from falling on the gate electrodes 4. An opening 6 is formed above the photodiode 2 so that the photodiode 2 can receive light.

The gate insulating film 3 is formed between the gate electrode 4 and the semiconductor substrate 1 so as to insulate them. An interlayer insulating film 5 is formed between the gate electrode 4 and the light-shielding film 10a so as to insulate them. A smoothing layer 8 is deposited so as to cover the entire surface of the semiconductor substrate 1 in which the above-described structure is formed to smooth the surface of the substrate. A combination of an upper convex lens 9 and an on-chip microlens 16 focuses incident light in the vicinity of the surface of the photodiode 2. A color filter 15 is formed on the upper surface of the smoothing layer 8 and transmits light having a specific wavelength (red, green, blue, etc.).

Figure 2:
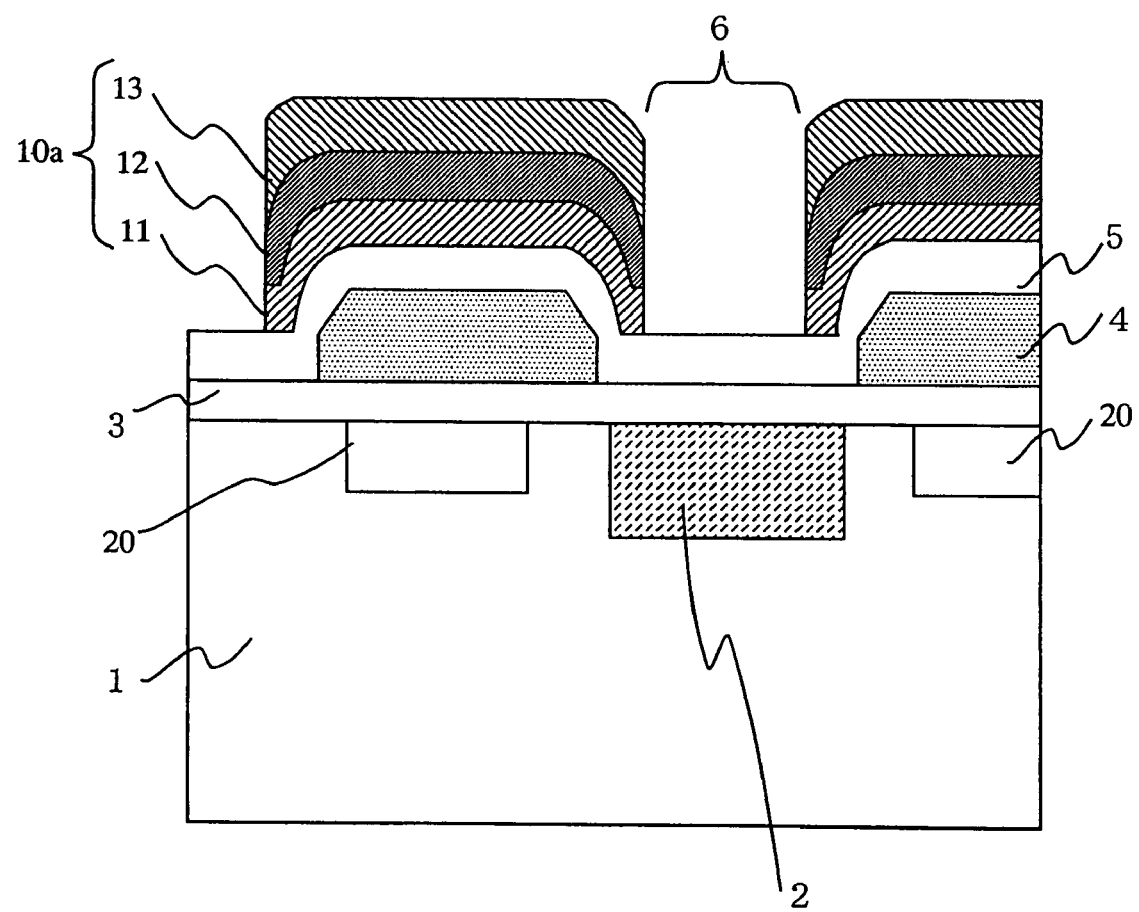
FIG. 2 is a cross-sectional view showing a structure of a light-shielding film of a solid-state imaging device of a first embodiment of the present invention.

Hereinafter, the light-shielding film 10a, which is a feature of the present invention, will be described more specifically with reference to the accompanying drawings. FIG. 2 is a cross-sectional view showing a structure of the light-shielding film 10a of a solid-state imaging device of the first embodiment of the present invention. The light-shielding film 10a includes a high melting point metal film or a high melting point metal compound film having light-shielding properties. Examples of the high melting point metal film include a tungsten film, a molybdenum film, a tantalum film, a platinum film, and a copper film. Examples of the high melting point metal compound film include a tungsten silicide film, a tungsten-titanium alloy film, a titanium nitride film, and a tungsten nitride film. This embodiment will be described by taking a tungsten film having excellent light-shielding properties, specifically, a tungsten-sputtered film 11 and a tungsten CVD film 12. The tungsten CVD film 12 formed by a CVD method has generally a weak adhesion with the interlayer insulating film 5 formed of silicon oxide or the like, so that a tungsten-sputtered film 11 formed by sputtering is provided as an adhesive layer between the interlayer insulating film 5 and the tungsten CVD film 12.

The surface of the light-shielding film 1a is formed so as to have the property of adsorbing and bonding to hydroxyl groups when the surface is in contact with air. Such properties make it difficult that a resist pattern is peeled when patterning the light-shielding film 10a, as described later. This embodiment will be described by taking an amorphous silicon film 13 as an example of the film having such properties.

The light-shielding film 10a of this embodiment is a multilayered film having a three layered structure in which the tungsten-sputtered film 11, the tungsten CVD film 12 and the amorphous silicon film 13 are laminated in this order from the substrate side.

Figure 3A:
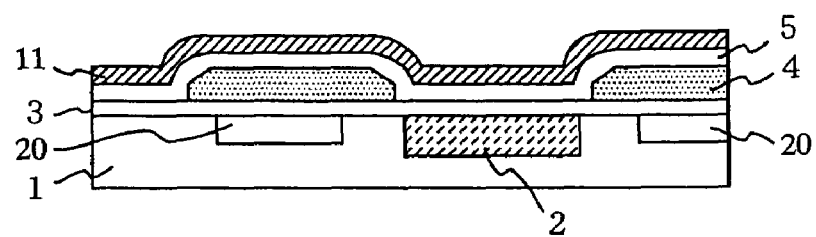
FIGS. 3A to 3F are cross-sectional views showing a production process of the light-shielding film shown in FIG. 2.

FIGS. 3A to 3F are cross-sectional views for each step showing the process of producing the light-shielding film of the solid-state imaging device shown in FIG. 2. Hereinafter, a method for producing the solid-state imaging device of the first embodiment will be described with reference to FIGS. 3A to 3F. FIG. 3A shows a state in which the tungsten-sputtered film 11 is formed as a first film constituting the light-shielding film 10a on the semiconductor substrate 1. In order to obtain the solid-state imaging device in an early stage as shown in FIG.3A, first, the photodiode 2 and the charge transfer portion 20 are formed in the main surface of the semiconductor substrate 1, using an ion implantation method or other methods. Then, the gate insulating film 3 is deposited on the surface of this semiconductor substrate 1 by thermal oxidation or the CVD method. The gate electrode 4 is formed by depositing a polysilicon film on this gate insulating film 3 by the CVD method and performing photolithography, dry-etching and the like to shape the film into a necessary pattern (not shown). Then, the interlayer insulating film 5 made of silicon oxide is deposited so as to cover the gate electrode 4 and the gate insulating film 3 by oxidation/CVD.

The tungsten-sputtered film 11 is formed as a first film constituting the light-shielding film 10a on the surface of the substrate constituted as above. More specifically, the pressure in the chamber of a pressure-reducible CVD apparatus is controller to 30 Torr, and the substrate temperature is set to 450° C., so that the tungsten-sputtered film 11 having a thickness of 50 nm is formed by sputtering.

Figure 3B:
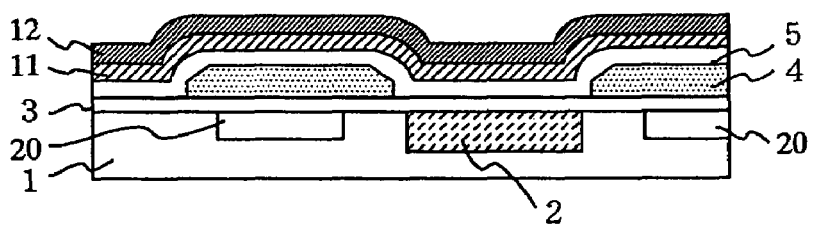

FIG. 3B is a state in which the tungsten CVD film 12 is formed as a second film constituting the light-shielding film on the tungsten-sputtered film 11. First, the tungsten CVD film 12 having a thickness of 150 nm is deposited on the tungsten-sputtered film 11 by the CVD method. More specifically, a tungsten nucleation layer having a thickness of 50 nm is formed by supplying a mixed gas of $WF_6$ with 20 sccm and $SiH_4$ with 10 sccm as a reactant gas to the chamber that is controlled to 30 Torr. Then, the tungsten CVD film 12 having a thickness of 150 nm is formed by supplying a mixed gas of $WF_6$ with 95 sccm and $H_2$ with 2000 sccm to the chamber that is controlled to 90 Torr.

Figure 3C:
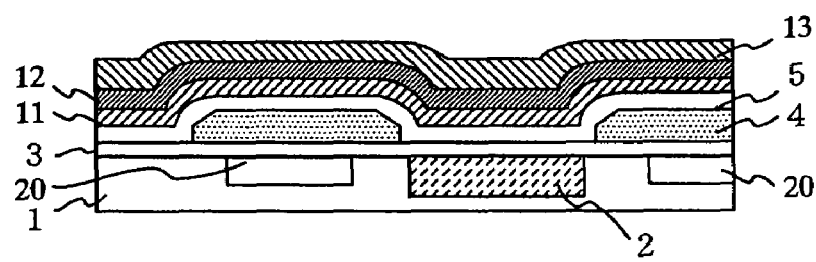

FIG. 3C shows a state in which the amorphous silicon film 13 is formed as a third film constituting the light-shielding film on the tungsten CVD film 12. The amorphous silicon film 13 can be obtained by performing a surface treatment on the surface of the substrate constituted as above. More specifically, the pressure in the chamber is controlled to 30 Torr while the substrate temperature is set to 450° C., and $SiH_4$ is supplied at a flow of 30 sccm for 20 sec. Thus, the amorphous silicon film 13 is formed on the tungsten CVD film 12.

Figure 3D:
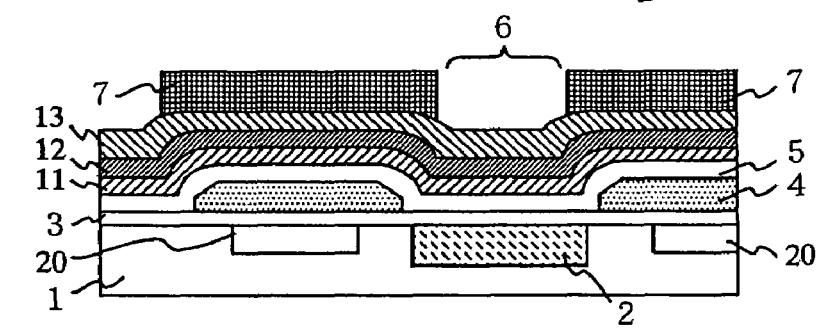

FIG. 3D is shows a state in which a resist pattern 7 is formed on the amorphous silicon film 13. In order to form the resist pattern 7, first, a surfactant is applied onto the amorphous silicon film 13 formed by the surface treatment as described above. As the surfactant, for example, HMDS is used.

After the surfactant is applied, a resist is applied to form a resist film, so that a pattern is formed into a desired shape. More specifically, first a resist film is formed on the amorphous silicon film 13 that has been subjected to a HMDS treatment. Then, the obtained resist film is exposed to light and developed so that a resist pattern 7 in which an opening portion 6 is formed above the photodiode 2.

Figure 3E:
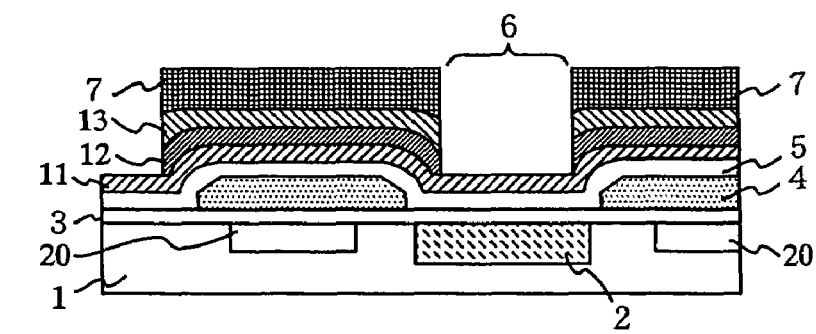

FIG. 3E shows a state in which the first, the second and the third films are patterned. In order to form the first, the second and the third films into such a pattern shape, first, an etching treatment is performed to the metal films whose surfaces are processed, using the resist pattern 7 as a mask. More specifically, the amorphous silicon film 13, the tungsten CVD film 12 and the tungsten-sputtered film 11 are subjected to a dry-etching treatment, using the resist pattern 7 as a mask.

Figure 3F:
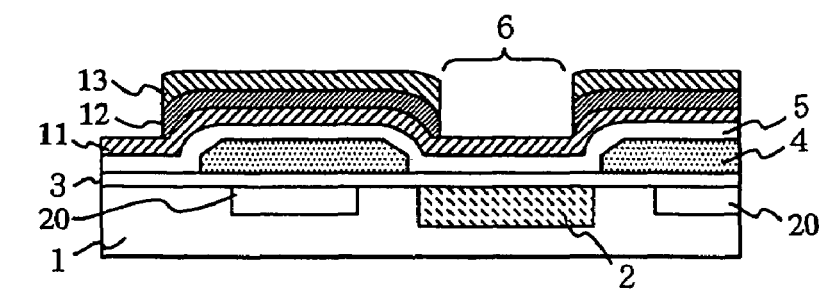

FIG. 3F is a state of the patterned light-shielding film 10a. The light-shielding film 10a can be obtained by removing the resist pattern 7 after the dry-etching treatment.

Next, the reason why the resist pattern 7 can be prevented from being peeled when forming the light-shielding film 10a of this embodiment will be described. FIGS. 4A to 4C are schematic diagrams showing the reason why the tungsten CVD film 12 and the resist pattern 7 are tightly attached. FIG. 4A is a state in which a resist 18 is applied onto the surface of the amorphous silicon film 13 that was in contact with air. The amorphous silicon film 13 is formed by supplying $SiH_4$ to the surface of the tungsten CVD film 12 at 30 sccm for 20 sec. This amorphous silicon film 13 is exposed to air until a surfactant is applied. In this time, water vapor in the air that has been contact with the amorphous silicon film 13 is degraded, so that silicon (Si) constituting the amorphous silicon film 13 and a hydroxyl group (OH) are bonded or adsorbed. Furthermore, the degradation of the waver vapor produces hydrogen. The surface of the amorphous silicon film 13 that is bonded or absorbed to hydroxyl groups becomes hydrophilic (lipophobic).

On the other hand, the molecules of the resist 18 are hydrophobic (lipophilic). Therefore, when a resist is applied to the amorphous silicon film 13 that has become hydrophilic, the resist is repelled. Describing this phenomenon in a simple manner, this is as if water is formed on the amorphous silicon film 13 and the resist 18, which is oil, is repelled.

FIG. 4B is a structural formula 19 of the HMDS that is the surfactant. When the HMDS having such a structure is applied to the amorphous silicon film 13 to which surface the hydroxyl groups 17 are bonded or adsorbed, a part thereof is degraded and bonded to the surface of the amorphous silicon film 13.

FIG. 4C is a state in which the resist 18 is applied to the surface of the amorphous silicon film 13 to which the HMDS is bonded. The surface of the amorphous silicon film 13 to which the HMDS is bonded is covered with methyl groups 21, which is hydrophobic (lipophilic), and therefore becomes hydrophobic (lipophilic). The resist 18 is hydrophobic (lipophilic) and therefore easily is bonded to the surface of this amorphous silicon film 13, so that the adhesion between the amorphous silicon film 13 and the resist pattern 7 is increased.

Thus, the amorphous silicon film 13 and the resist pattern 7 are attached firmly to each other via the surfactant (HMDS), so that the resist pattern 7 can be suppressed from being peeled during light exposure and development treatment, and fine patterning of the light-shielding film 10a becomes possible. Thus, a solid-state imaging device in which the size of the pixels can be reduced and the yield is good can be realized. Furthermore, such an effect can be obtained even if the amorphous silicon film 13 is very thin.

As described above, a surfactant (HMDS) is applied onto the surface of the tungsten CVD film 12 in a conventional solid-state imaging device. However, the tungsten CVD film 12 does not absorb as many hydroxyl groups 17 from water vapor in the air as the amorphous silicon film 13 used in this embodiment, and the amount of the HMDS 19 that is adsorbed to the hydroxyl groups 17 and degraded is smaller than in this embodiment. Therefore, the surface of the light-shielding film 10e of the conventional solid-state imaging device becomes less hydrophobic than the light-shielding film 10a of this embodiment, and the adhesion between the tungsten CVD film 12 and the resist pattern 7 is far weaker than that of the amorphous silicon film 13 and the resist pattern 7 of this embodiment.

The first embodiment has been described above. However, the property of the light-shielding film 10a of adsorbing and bonding to hydroxyl groups when the surface thereof is brought into contact with air can be obtained with other structures than the amorphous silicon film 13. The same effect can be obtained by a structure in which silicon is contained on the very surface of the tungsten CVD film 12 in the process shown in FIG. 3C. This aspect will be described below.

Figure 5:
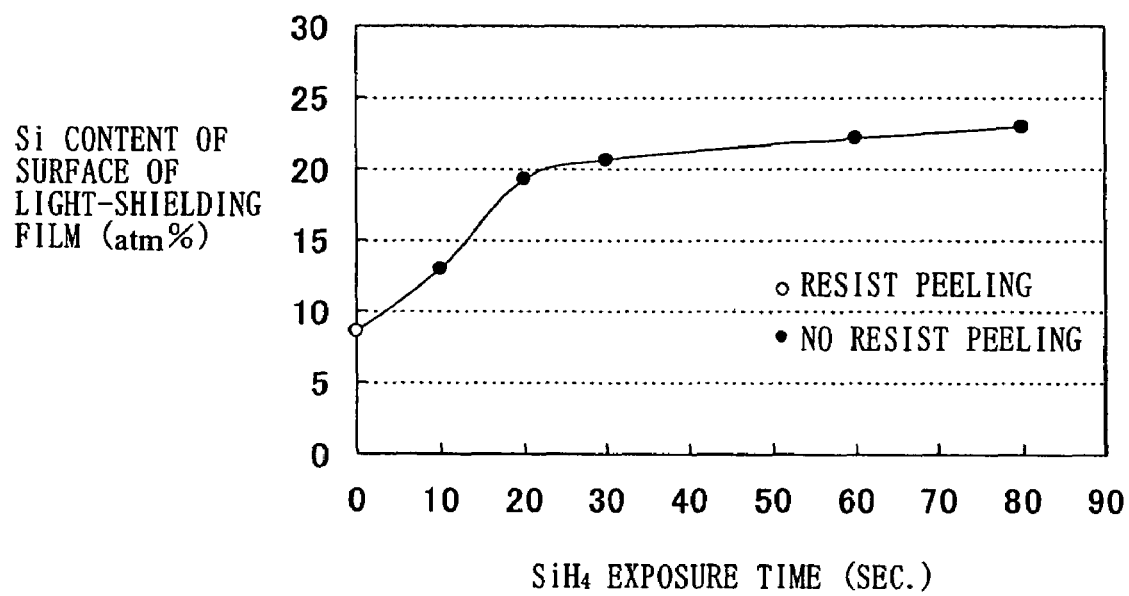
FIG. 5 is a graph showing the relationship between the $SiH_4$ exposure time, the silicon content of the light-shielding film, and resist peeling.

FIG. 5 is a graph showing the relationship between the exposure time during which the tungsten CVD film 12 is exposed to an $SiH_4$ atmosphere and the silicon content on the surface of the film. The white circle indicates that there was peeling of the resist pattern 7, and the black circle indicates that there was no peeling of the resist pattern 7. The silicon content was measured with an X-ray photoelectron spectroscopy (XPS).

As evident from FIG. 5, when the silicon content on the film surface of the tungsten CVD film 12 is 13% or more, the effect of suppressing peeling of the resist pattern 7 as described above can be obtained. Furthermore, it is experimentally confirmed that when the tungsten film surface is exposed to $SiH_4$ at 30 sccm for 5 seconds or more, the silicon content on the surface of the tungsten film becomes about 10% or more, and when such a silicon content is reached, the resist pattern 7 is not peeled. There is no change in the silicon content from an exposure time of about 20 seconds during which the film is exposed to $SiH_4$. This is because the amorphous silicon film 13 is formed on the tungsten CVD film 12, instead of silicon being contained in the surface of the tungsten CVD film 12.

Second Embodiment

In this embodiment, a solid-state imaging device having a light-shielding film whose surface is formed of a high melting point metal silicide film, instead of the light-shielding film 10a whose surface is formed of the amorphous silicon film 13 of the first embodiment will be described. The solid-state imaging device of this embodiment has substantially the same structure as the solid-state imaging device 100 of the first embodiment, so that in the following, only different points will be described.

Figure 6:
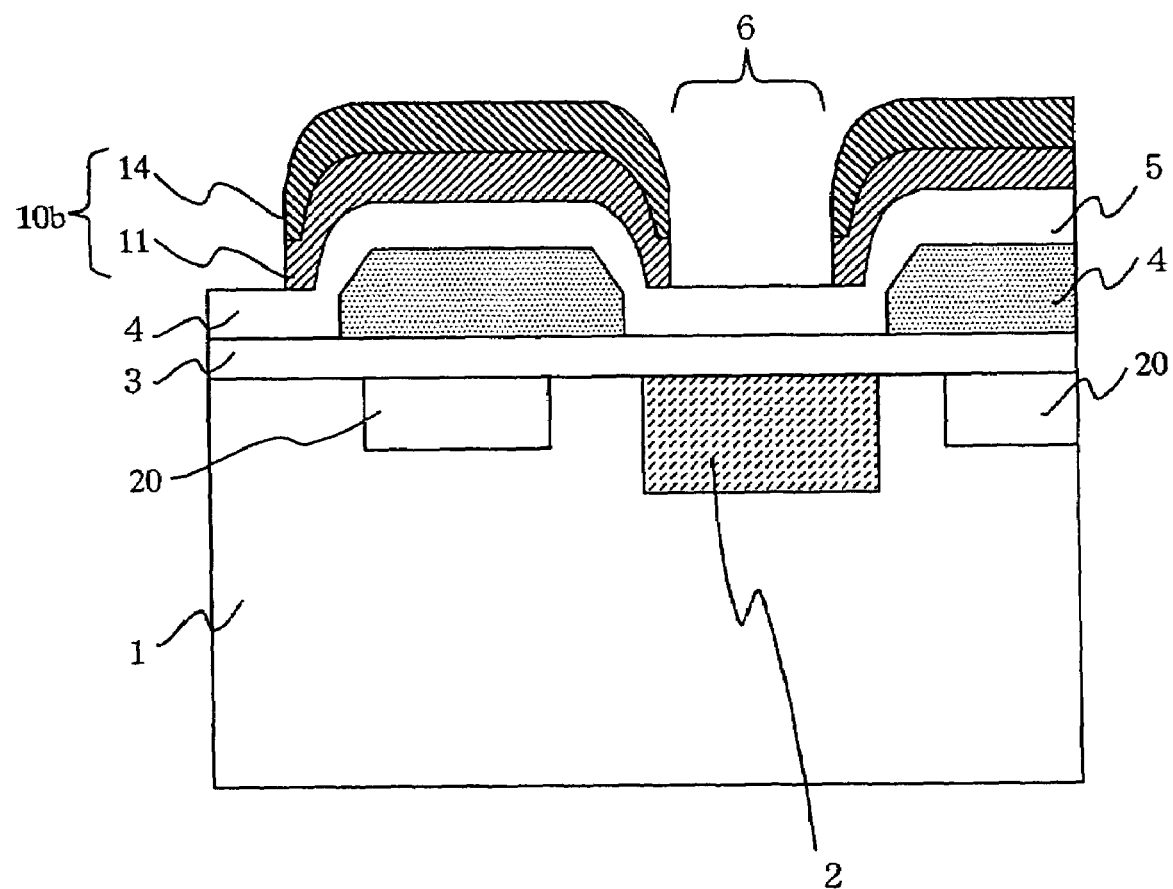
FIG. 6 is a cross-sectional view showing a structure of a light-shielding film of a solid-state imaging device of a second embodiment.

FIG. 6 shows a cross-sectional structure of a solid-state imaging device of the second embodiment of the present invention. In FIG. 6, the light-shielding film 10b is a film having a two-layered structure in which a tungsten-sputtered film 11, which is a high melting point metal film, and a tungsten silicide film 14, which is a high melting point metal silicide film, are laminated. The tungsten-sputtered film 11 serves as an adhesive layer for the tungsten silicide film 14. The tungsten silicide film 14 has the property of adsorbing or bonding to hydroxyl groups when it is in contact with air, and has an effect of suppressing peeling of the resist film when patterning the light-shielding film 10b.

The light-shielding film 10b having such a structure can be produced in the following manner. First, similarly to the first embodiment, the process of forming a metal film shown in FIG. 3A is performed to form the tungsten-sputtered film 11. Next, a tungsten silicide film 14 having a thickness of 200 nm is formed by the CVD method, instead of the process of forming a metal film shown in FIG. 3B and the surface treatment process shown in FIG. 3C. More specifically, a mixed gas of $WF_6$ at 500 sccm and $SiH_2Cl_2$ (dichlorosilane) at 300 sccm as a reactant gas is introduced to a chamber that is controlled to 1.2 Torr, so that a tungsten silicide film 14 having a thickness of 200 nm is formed. The substrate temperature is set to 550° C. In this process, the process of forming a metal film and the surface treatment process are performed at the same time.

Then, the light-shielding film 10b is formed by performing the process of applying a surfactant, the process of patterning a resist, the process of etching a metal film and the process of removing the resist shown in FIGS. 3D to 3F. However, in the process of etching the metal film, the tungsten silicide film 14 and the tungsten-sputtered film 11 are dry-etched.

In the light-shielding film 10b having the above-described structure, the tungsten silicide film 14 and the molecules 18 constituting the resist can be easily bonded, and the adhesion between the tungsten silicide film 14 and the resist pattern 7 can be increased, so that peeling of the resist pattern 7 can be suppressed in the light exposure and development treatment.

As a result of measuring the silicon content on the surface of the tungsten silicide film 14 with an X-ray photospectroscopy, it was confirmed that when the silicon content is 10 atm % or more, peeling of the resist can be prevented.

In the above, this embodiment has been described by taking a tungsten silicide film as the high melting point metal silicide film. However, films formed of other silicide compounds of a high melting point metal such as molybdenum and tantalum can be used.

Third Embodiment

In this embodiment, a solid-state imaging device having a light-shielding film whose surface is formed of a high melting point metal silicide film having a three-layered structure, instead of the light-shielding film 10b having a two-layered structure of the second embodiment will be described. The second embodiment is different from the third embodiment in the number of films constituting the light-shielding film, and therefore in the following, only different points will be described.

Figure 7:
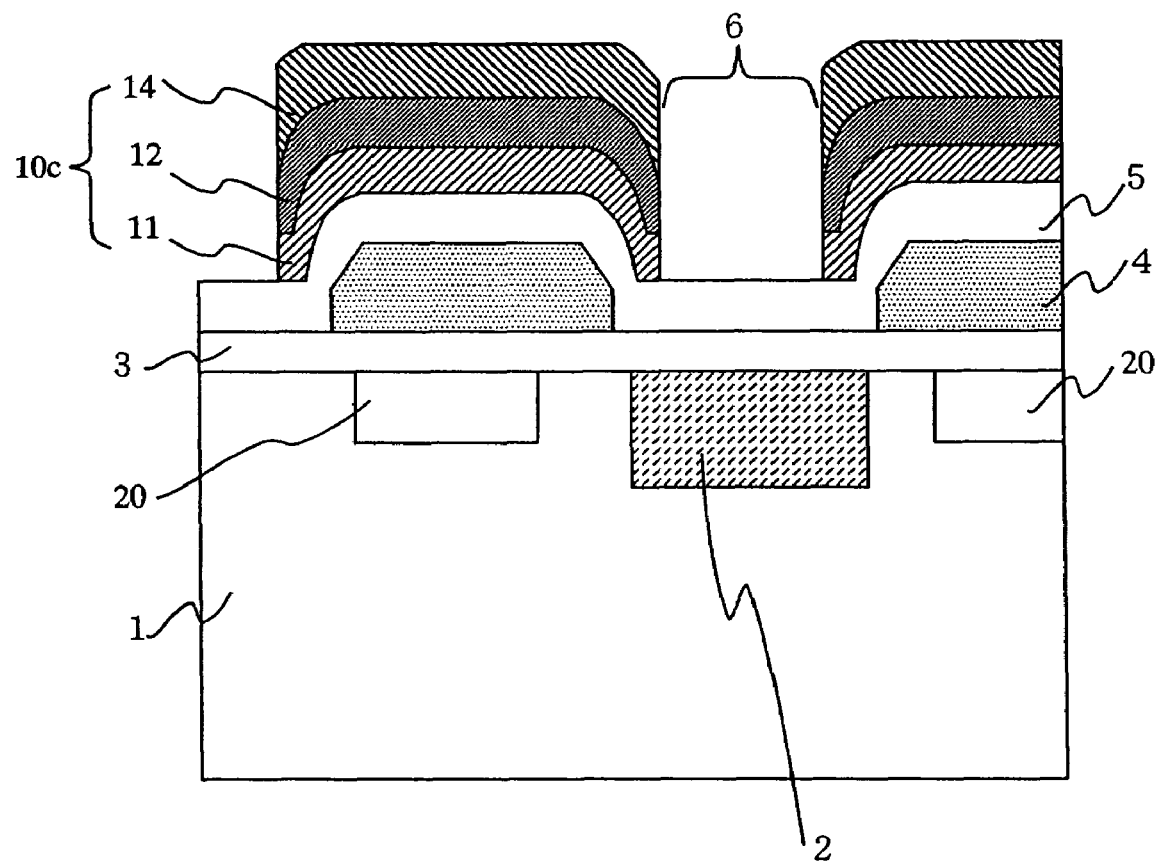
FIG. 7 is a cross-sectional view showing a structure of a light-shielding film of a solid-state imaging device of a third embodiment.

FIG. 7 shows a cross-sectional structure of a solid-state imaging device of the third embodiment of the present invention. In FIG. 7, the light-shielding film 10c is a film having a three-layered structure in which a tungsten-sputtered film 11, and a tungsten CVD film 12, which are high melting point metal films, and a tungsten silicide film 14, which is a high melting point metal silicide film, are laminated. The tungsten-sputtered film 11 serves as an adhesive layer for the tungsten CVD film 12. The tungsten silicide film 14 has the property of adsorbing or bonding to hydroxyl groups when it is in contact with air, and has an effect of suppressing peeling of the resist film when patterning the light-shielding film 10c.

The light-shielding film 10c having such a structure can be produced in the following manner. First, similarly to the first embodiment, the processes of forming a metal film shown in FIGS. 3A and 3B are performed to form the tungsten-sputtered film 11 and the tungsten CVD film 12.

Next, instead of the surface treatment process shown in FIG. 3C, a surface treatment process is performed by forming the tungsten silicide film 14. More specifically, a mixed gas of $WF_6$ at 500 sccm and $SiH_2Cl_2$ (dichlorosilane) at 300 sccm as a reactant gas is introduced to a chamber that is controlled to 1.2 Torr, so that a tungsten silicide film 14 having a thickness of 200 nm is formed by the CVD method. The substrate temperature is set to 550° C.

Then, the light-shielding film 10c is formed by performing the process of applying a surfactant, the process of patterning a resist, the process of etching a metal film and the process of removing the resist shown in FIGS. 3D to 3F. However, in the process of etching the metal film, the tungsten silicide film 14, the tungsten CVD film 12 and the tungsten-sputtered film 11 are dry-etched.

Also in the light-shielding film 10c having the above-described structure, similarly to the second embodiment, the tungsten silicide film 14 and the resist 18 can be easily bonded to each other, and the adhesion between the tungsten silicide film 14 and the resist pattern 7 can be increased, so that peeling of the resist pattern 7 can be suppressed in the light exposure and development treatment. Furthermore, when the silicon content on the surface of the tungsten silicide film 14 is 10 atm % or more, peeling of the resist can be prevented. Moreover, films formed of other silicide compounds of a high melting point metal such as molybdenum and tantalum, instead of the tungsten silicide film, can be used as the high melting point metal silicide film.

In the structure of the second embodiment, the tungsten silicide film 14 is formed directly on the tungsten-sputtered film 11, so that the light-shielding properties may be sufficient, for example, in a visible region of 400 nm to 800 nm, which is commonly used in a solid-state imaging device in some cases. However, by providing the tungsten CVD film 12 on the tungsten-sputtered film 11, as in this embodiment, the solid-state imaging device can have sufficient light-shielding properties even in the above-described visible region.

Fourth Embodiment

In this embodiment, a solid-state imaging device having a light-shielding film whose surface is formed of an oxide film, instead of the light-shielding film 10a whose surface is formed of the amorphous silicon film 13 of the first embodiment will be described. The solid-state imaging device of this embodiment has substantially the same structure as the solid-state imaging device 100 of the first embodiment, so that in the following, only different points will be described.

Figure 8:
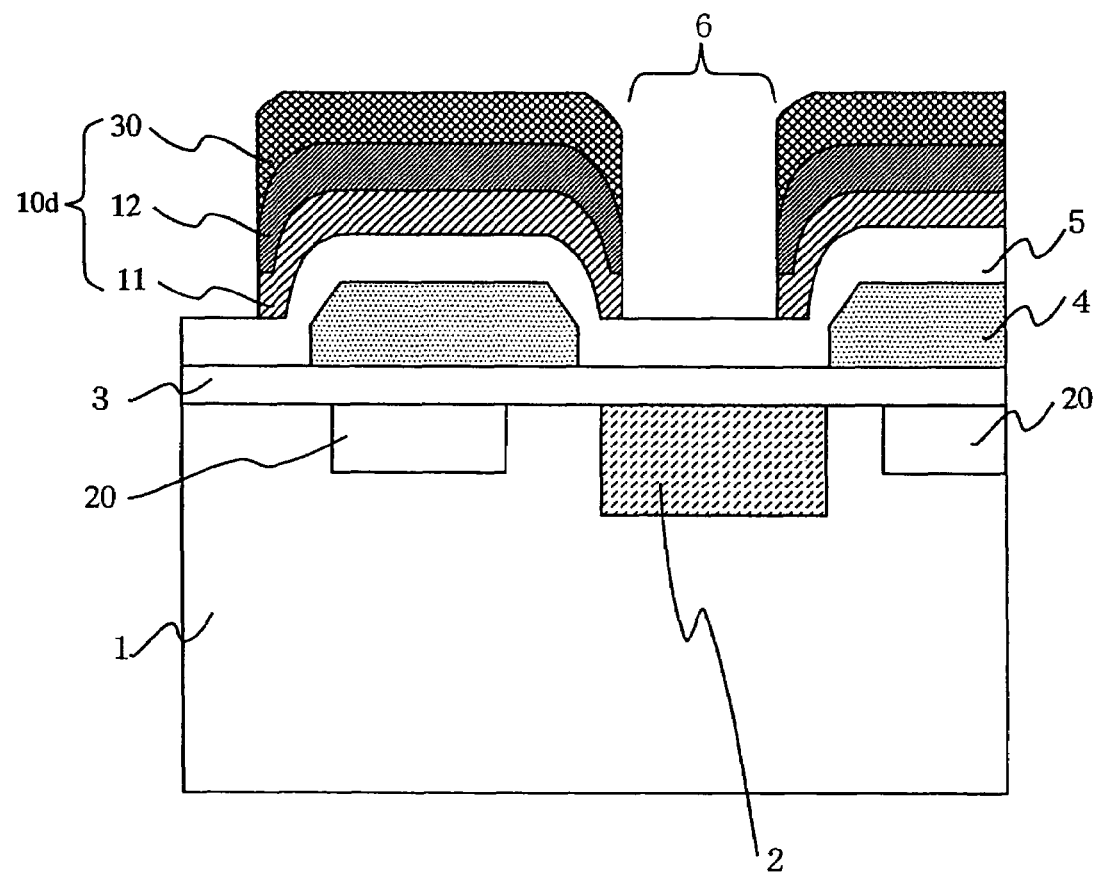
FIG. 8 is a cross-sectional view showing a structure of a light-shielding film of a solid-state imaging device of a fourth embodiment.
Figure 9:
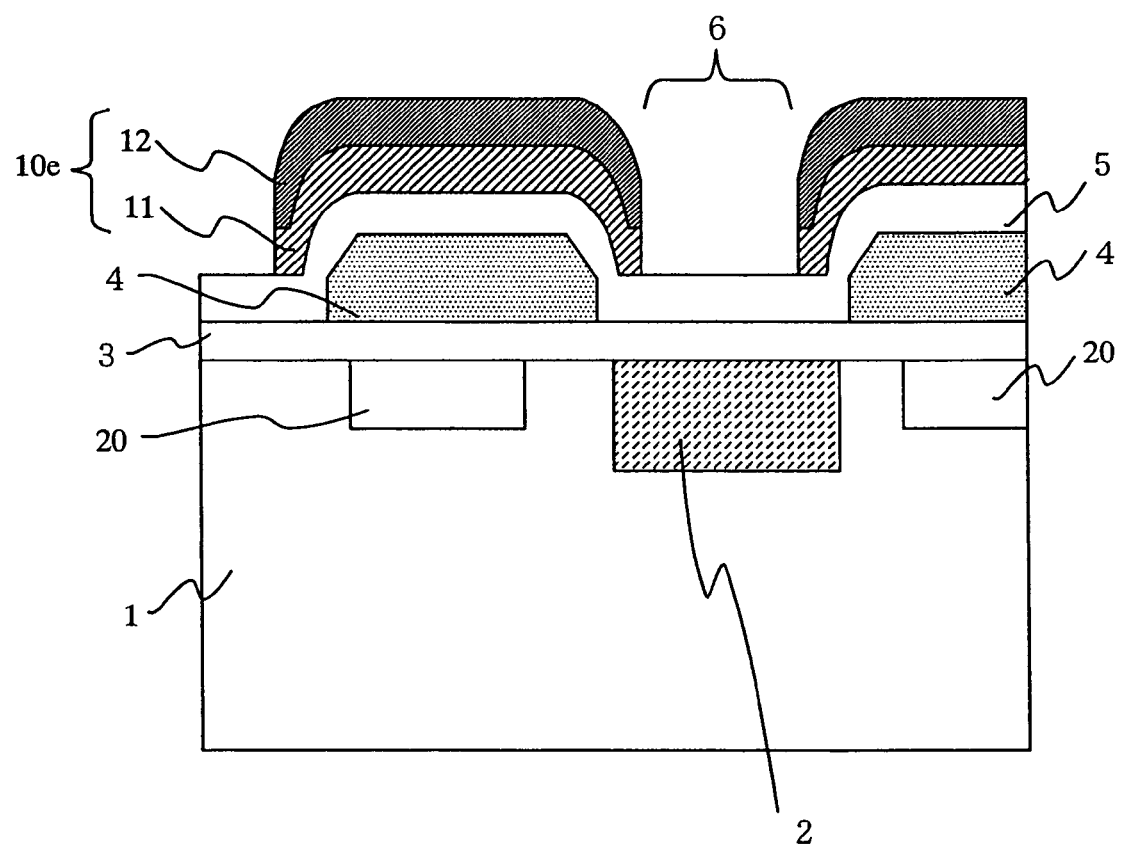
FIG. 9 is a cross-sectional view showing a structure of a light-shielding film of a conventional solid-state imaging device.
Figure 10A:
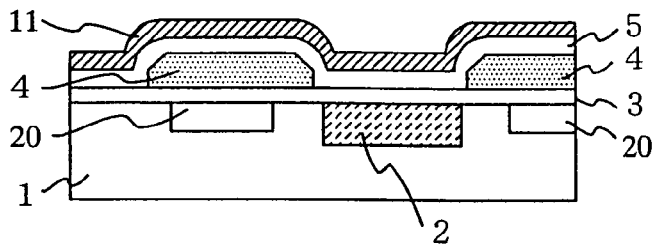
FIGS. 10A to 10E are cross-sectional views showing a production process of the light-shielding film shown in FIG. 9.
Figure 10B:
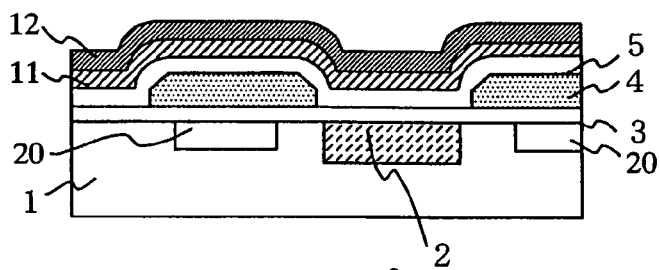
Figure 10C:
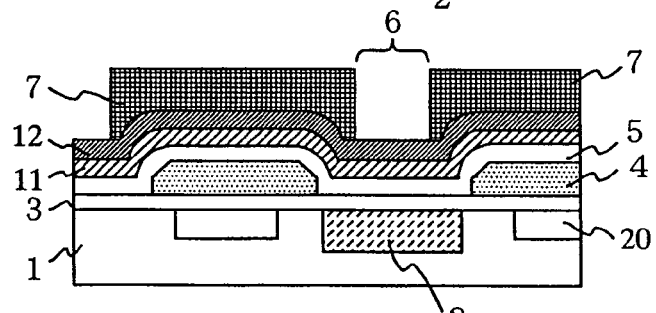
Figure 10D:
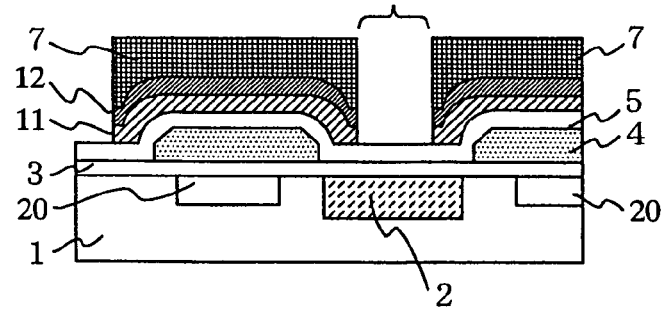
Figure 10E:
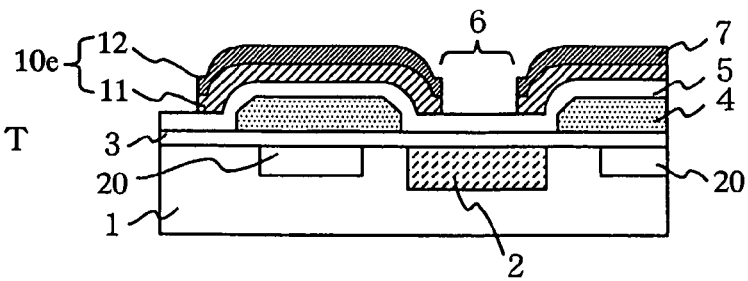

FIG. 8 shows a cross-sectional structure of a solid-state imaging device of the fourth embodiment of the present invention. In FIG. 8, the light-shielding film 10d is a film having a three-layered structure in which a tungsten-sputtered film 11, and a tungsten CVD film 12, which are high melting point metal films, and an oxide film 30 are laminated. The tungsten-sputtered film 11 serves as an adhesive layer for the tungsten CVD film 12. The oxide film 30 has the property of adsorbing or bonding to hydroxyl groups when it is in contact with air, and has an effect of suppressing peeling of the resist film when patterning the light-shielding film 10d. As the oxide film 30 having such a property, silicon oxide can be used preferably.

The light-shielding film 10d having such a structure can be produced in the following manner. Similarly to the first embodiment, the processes of forming a metal film shown in FIGS. 3A and 3B are performed to form the tungsten-sputtered film 11 and the tungsten CVD film 12.

Next, instead of the surface treatment process shown in FIG. 3C, a surface treatment process is performed by forming the oxide film 30. More specifically, a silicon oxide film ($SiO_2$) 30 having a thickness of 50 nm is formed by the CVD method.

Then, the light-shielding film 10d is formed by performing the process of applying a surfactant, the process of -patterning a resist, the process of etching a metal film and the process of removing the resist shown in FIGS. 3D to 3F. However, in the process of etching the metal film, the oxide film 30, the tungsten CVD film 12 and the tungsten-sputtered film 11 are dry-etched.

Also in the light-shielding film 10d having the above-described structure, similarly to the above-described embodiments, the oxide film 30 and the resist 18 can be easily bonded to each other, and the adhesion between the oxide film 30 and the resist pattern 7 can be increased, so that peeling of the resist pattern 7 can be suppressed in the light exposure and development treatment.

The above-described embodiments have been described by taking HMDS as an example of the surfactant, but the surfactant is not limited thereto. Any surfactant can be used, as long as it has a hydrophilic group that can be bonded to a hydroxyl group on the surface of the light-shielding film and has a hydrophobic group such as a methyl group.

The above-described embodiments have been described by taking a high melting point metal film or a high melting point metal compound film as an example of the metal film included in the light-shielding film, but a film that has light-shielding ability and can be formed by sputtering or the CVD method, such as other compound films of a high melting point metal, films formed of a low melting point metal such as aluminum or an alloy thereof, or the like may be included in a part of the light-shielding film.

In the above-described embodiments, an example of film-formation conditions for forming a light-shielding film has been shown, but the film-formation conditions are not limited to those shown in the above-described embodiments. Furthermore, the structure other than the light-shielding film of the solid-state imaging device is not limited to that shown in FIG. 1.

The structure of the light-shielding film and the method for producing the light-shielding film of the present invention can increase the adhesion of the resist and form a fine light-shielding pattern, and therefore can be applied to a solid-state imaging device that seeks for further increase of the number of the pixels and further reduction of the size of the pixels.

While the invention has been described in detail, the foregoing description is in all aspects illustrative and not restrictive. It is understood that numerous other modifications and variations can be devised without departing from the scope of the invention.

What is claimed is:

1. A method for producing a solid-state imaging device comprising a light-shielding film on a semiconductor substrate in which a light-receiving portion is formed, the light-shielding film having an opening portion above the light-receiving portion, the method comprising:

a metal film formation step of forming at least one of a high melting point metal film and a high melting point metal compound film having a light-shielding property on the semiconductor substrate in which the light-receiving portion is formed, a surface treatment step of providing a surface of the metal film with a property of adsorbing or bonding to a hydroxyl group when it is in contact with air, a surfactant application step of applying a surfactant onto the film that has been subjected to the surface processing, a patterning step of applying a resist on the surfactant to form a pattern, an etching step of performing an etching treatment of the metal film that has been subjected to the surface processing, using the resist formed into a pattern as a mask, and a resist removing step of removing the resist.

2. The method for producing a solid-state imaging device according to claim 1, wherein in the surface treatment step, a gas containing silicon is allowed to flow along the surface of the metal film so that silicon is contained in the metal film.

3. The method for producing a solid-state imaging device according to claim 1, wherein in the surface treatment step, a gas containing silicon is allowed to flow along the surface of the metal film so that an amorphous silicon film is formed on the metal film.

4. The method for producing a solid-state imaging device according to claim 1, wherein in the surface treatment step, a high melting point metal silicide film is formed on the metal film.

5. The method for producing a solid-state imaging device according to claim 1, wherein in the surface treatment step, an oxide film is formed on the metal film.

* * * * *